(12) United States Patent
Anderson et al.

(10) Patent No.: US 8,637,871 B2
(45) Date of Patent: Jan. 28, 2014

(54) ASYMMETRIC HETERO-STRUCTURE FET AND METHOD OF MANUFACTURE

(75) Inventors: Brent A. Anderson, Jericho, VT (US); Jeffrey B. Johnson, Essex Junction, VT (US); Edward J. Nowak, Essex Junction, VT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 120 days.

(21) Appl. No.: 12/939,462

(22) Filed: Nov. 4, 2010

(65) Prior Publication Data

US 2012/0112206 A1 May 10, 2012

(51) Int. Cl.
*H01L 29/15* (2006.01)

(52) U.S. Cl.
USPC ............. 257/77; 438/179; 257/E21.431

(58) Field of Classification Search
USPC .......... 257/77, E21.431, 200; 438/179, 285, 438/286
See application file for complete search history.

(56) References Cited

U.S. PATENT DOCUMENTS

| | | | |
|---|---|---|---|
| 4,992,387 A | 2/1991 | Tamura | |
| 6,214,679 B1* | 4/2001 | Murthy et al. | 438/299 |
| 2003/0116792 A1 | 6/2003 | Chen et al. | |
| 2007/0045611 A1* | 3/2007 | Zhu et al. | 257/20 |
| 2007/0090406 A1 | 4/2007 | Zhu et al. | |
| 2007/0096149 A1* | 5/2007 | Liu et al. | 257/192 |
| 2008/0073669 A1 | 3/2008 | Zhu et al. | |
| 2009/0014794 A1 | 1/2009 | Zhu et al. | |
| 2009/0026545 A1* | 1/2009 | Peidous | 257/368 |
| 2009/0045411 A1* | 2/2009 | Lin et al. | 257/77 |
| 2009/0045456 A1* | 2/2009 | Chen et al. | 257/327 |
| 2009/0050942 A1* | 2/2009 | Liu et al. | 257/288 |
| 2009/0061586 A1* | 3/2009 | Yu et al. | 438/296 |
| 2009/0283828 A1* | 11/2009 | Clark et al. | 257/347 |

FOREIGN PATENT DOCUMENTS

JP 2000332608 A 11/2000

OTHER PUBLICATIONS

Lee, et al., "Negative bias temperature instability characteristics of strained SiGe p MOSFETs", Electronics Letters, IEEE, vol. 43, No. 15, Jul. 19, 2007, Online No. 20071064, doi: 10.1049/el:20071064, pp. 835-836.

International Search Report in PCT/US2011/057779, Feb. 28, 2012, 2 pages.

* cited by examiner

*Primary Examiner* — Wael Fahmy
*Assistant Examiner* — Sarah Salerno
(74) *Attorney, Agent, or Firm* — Michael LeStrange; Roberts Mlotkowski Safran & Cole, P.C.

(57) ABSTRACT

An asymmetric hetero-structure FET and method of manufacture is provided. The structure includes a semiconductor substrate and an epitaxially grown semiconductor layer on the semiconductor substrate. The epitaxially grown semiconductor layer includes an alloy having a band structure and thickness that confines inversion carriers in a channel region, and a thicker portion extending deeper into the semiconductor structure at a doped edge to avoid confinement of the inversion carriers at the doped edge.

26 Claims, 3 Drawing Sheets

ASYMMETRIC HETERO-STRUCTURE FET AND METHOD OF MANUFACTURE

FIELD OF THE INVENTION

The invention relates to semiconductor structures and methods of manufacture and, more particularly, to an asymmetric hetero-structure FET and method of manufacture.

BACKGROUND

There has been significant investigation into performance improvements of metal-oxide-semiconductor field effect transistors (MOSFETs). A major challenge, though, has been the scaling of the MOSFET to improve the drive current without degradation of the short channel performance and off-state leakage current. To improve performance, a thin confining semiconductor channel region, for example, SiGe, has attracted attention because of hole confinement in the reduced-band-gap layer which, in turn, leads to PMOSFET short-channel-effects improvement. However, the smaller band gap in the SiGe layer can also confine carriers in the pinch-off region of a pFET, when operated in saturation, leading to reduced drive current.

More specifically, as the SiGe channel layer thickness is reduced with decreased transistor gate length, in order to increase both the operation speed and the number of components per chip, the degradation in saturated drive current is increased due to enhanced confinement of carriers in pinch-off nearby the drain of the FET, thereby limiting performance improvements with gate-length scaling.

Accordingly, the suppression of short channel without sacrificing drive current is a key challenge in sub-100 nm devices.

SUMMARY

In a first aspect of the invention, a structure comprises a semiconductor substrate and an epitaxially grown semiconductor layer on the semiconductor substrate. The epitaxially grown semiconductor layer includes an alloy having a band structure and thickness that confines inversion carriers in a channel region, and a thicker portion extending deeper into the semiconductor structure at a doped edge to avoid confinement of the inversion carriers at the doped edge.

In another aspect of the invention, a structure comprises a channel formed over a silicon substrate and under a gate structure, separating a source region and a drain region. The structure further comprises a hetero-silicon layer formed in the channel and extending into the source region and the drain region. The hetero-silicon layer has a first thickness in the channel and a second thickness at an edge of the drain region, and extends into the drain region. The second thickness is greater than the first thickness.

In yet another aspect of the invention, a method comprises growing an epitaxially grown semiconductor layer on a semiconductor substrate and within a trench etched under and on a side of a gate structure. The epitaxially grown semiconductor layer includes an alloy having a band structure that confines inversion carriers in a channel region under the gate structure, and grown to a deeper portion into the semiconductor substrate at an edge of a doped region to avoid confinement of the inversion carriers at the doped edge.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the FET, which comprises the structures of the present invention. In still further embodiments, a method in a computer-aided design system is provided for generating a functional design model of the FET. The method comprises generating a functional representation of the structural elements of the FET.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to an asymmetric hetero-structure field effect transistor (FET) and method of manufacture. In embodiments, the FET includes a thin channel of confining semiconductor material with a portion of the semiconductor material extending deep at the drain edge to avoid confinement at the drain, while maintaining confinement in the remainder of the channel. More specifically, a thin hetero-structure channel material such as SiGe over silicon (for a pFET) results in superior short-channel effect suppression, due to channel inversion-layer confinement. However, the same confinement property also results in decreased saturated drain current. In order to address the decreased saturated drain current, the present invention includes a FET structure with a thin channel of confining semiconductor with a portion extending deep at the drain edge to avoid confinement at the drain, while maintaining confinement in the remainder of the channel.

In embodiments, the FET is a hetero-junction FET. The hetero junction FET comprises a semiconductor layer comprising a first semiconductor material, and a channel comprising a second semiconductor material. The channel is disposed above the semiconductor layer and below a gate structure. A source is at least partially contained within the second semiconductor layer. The drain is also at least partially contained within the second semiconductor layer; although the second semiconductor layer is thicker in the drain side than the source side of the device. That is, the second semiconductor layer is thicker adjacent to the drain and within the drain than its thickness in the remaining portion of the channel, e.g., between the source and the drain. This deep portion at the drain edge avoids confinement at the drain, while maintaining confinement in the remainder of the channel. The deep portion may alternatively be provided in the source and edge thereof.

Figure 1:
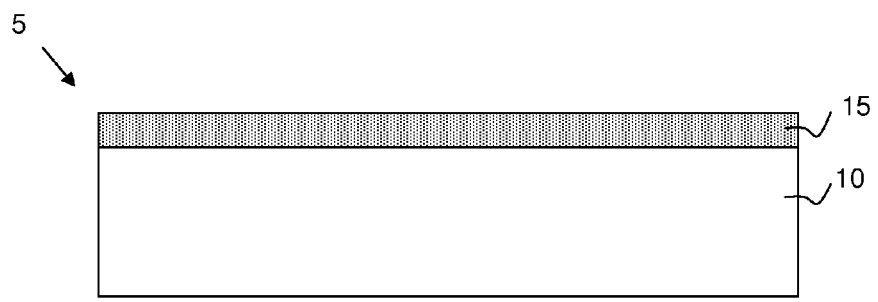
FIG. 1 is a beginning structure in accordance with aspects of the present invention.

FIG. 1 shows a beginning structure in accordance with aspects of the present invention. The structure 5 includes a wafer 10 such as, for example, BULK silicon or silicon on insulator (SOI). An epitaxial hetero-structure semiconductor layer 15 is grown on the wafer 10. In embodiments, the hetero-structure semiconductor layer 15 can be, for example, a hetero-silicon material that confines inversion carriers within the channel region of a FET. For example, in a pFET structure, the hetero-silicon material can be, for example, a SiGe alloy, more explicitly, $Si_{1-x}Ge_x$, where the mole fraction of Ge, x, may range from about 0.05 to 0.4. In an nFET structure, the hetero-silicon material can be, for example, a SiC alloy, more explicitly, $Si_{1-x}C_x$ alloy, where the mole fraction of C, x, may range from about 0.001 to 0.03. The hetero-structure semiconductor layer 15 can have a thickness of about 2 nm to about 10 nm.

Figure 2:
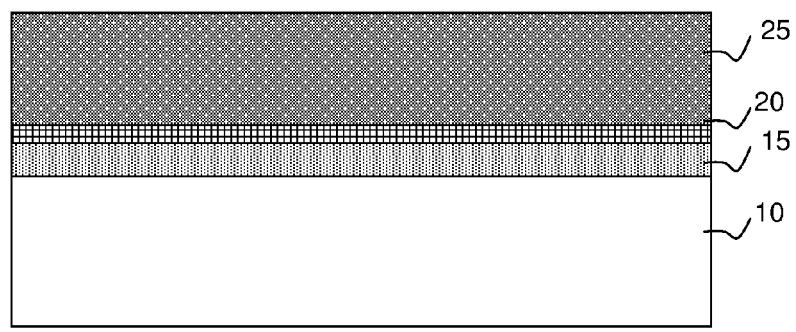
FIGS. 2-6 show processing steps and respective structures formed using the processing steps in accordance with aspects of the present invention.

FIG. 2 shows additional processes steps in accordance with aspects of the present invention. More specifically, FIG. 2 shows a gate dielectric layer 20 formed on the hetero-structure semiconductor layer 15. In embodiments, the gate dielectric layer 20 is a high-k dielectric stack that is deposited on the hetero-structure semiconductor layer 15. In embodiments, the deposition process can be, for example, chemical vapor deposition (CVD), plasma enhanced CVD (PECVD) atomic layer deposition (ALD) or other known deposition processes. In embodiments, the gate dielectric layer 20 can be a stack of, for example, silicon oxy-nitride and a hafnium based material such as, for example, hafnium silicate or hafnium oxide. In embodiments, the thickness of the gate dielectric layer 20 can be about 20 Å to about 110 Å. In more specific embodiments, the silicon oxy nitride can be about 5 Å to about 10 Å, and the hafnium based material can be about 20 Å to 100 Å.

Still referring to FIG. 2, a gate electrode 25 can be formed on the gate dielectric layer 20. In embodiments, the gate electrode 25 can be deposited on the gate dielectric layer 20 using conventional deposition processes such as, for example, CVD, PECVD, ALD, etc. In embodiments, the gate electrode 25 can be a stack such as, for example, a first layer of TiN or TaN and second layer of doped poly or alloys of Al, Ti or Ta or other gate electrode metal. In embodiments, the thickness of the first layer of TiN or TaN can be about 24 Å to 100 Å. The second layer of doped poly, etc. can have a thickness of about 100 Å to 500 Å.

Figure 3:
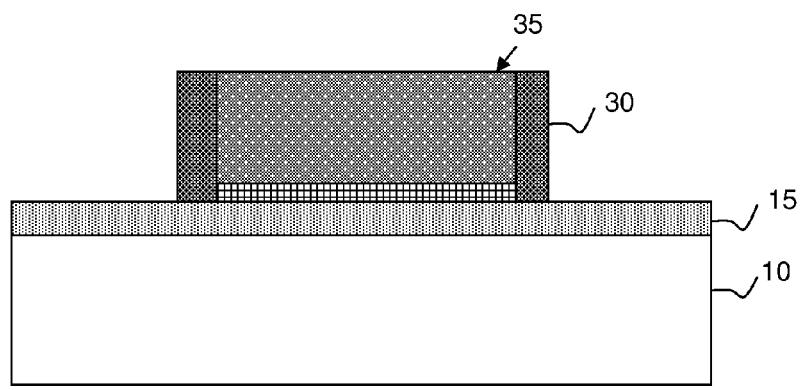

In FIG. 3, the gate electrode 25 and the gate dielectric layer 20 are patterned using conventional lithographic and etching processes. For example, a resist can be formed over the gate electrode 25 and exposed to light to form a pattern (openings). An etching process is then used to remove portions of the gate electrode 25 and gate dielectric layer 20. The etching process can be, for example, a reactive ion etching (RIE). The etching process can remove the resist or, alternative or in addition, the resist can be removed by a conventional stripping chemistry process such as, for example HCL.

Still referring to FIG. 3, spacers 30 are formed on the side of the patterned structure to form a gate structure 35. The spacers 30 can be, for example, nitride or oxide, formed by a conventional deposition and anisotropic etch process.

Figure 4:
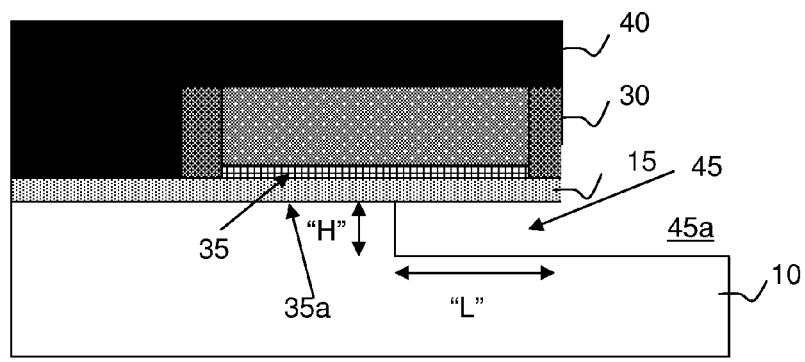

FIG. 4 shows additional processing steps and respective structure in accordance with aspects of the present invention. In particular, FIG. 4 shows the formation of an undercut 45 in the channel region 35a of the gate structure 35 and a recess 45a in a drain region (generally referred to as a trench). To form the undercut 45 and recess 45a, a resist 40 is formed over the structure and patterned in a conventional lithographic process. An etching process is then performed to form the undercut 45 and recess 45a.

In embodiments, the etching process can be tuned to form a recess and undercut with a certain depth "D" and length "L", using a combination of an isotropic and anisotropic etch process. In deciding the depth "D" of the undercut 45, it is important to take into consideration short channel effects, for example. For example, if the undercut is too shallow, the channel may still suffer from hole confinement. In embodiments, the depth "D" is about 50 Å to about 500 Å, with a specific embodiment being about 100 Å. The length "L" is about 20% of the channel 35a and, in specific embodiments is about 10 Å to 30 Å. This length is specifically engineered so that it does not negatively affect short channel effects; that is, the length of the undercut is specifically engineered to ensure that the confinement of inversion carriers is maintained in the channel 35a.

As should be understood by those of skill in the art, the etching process can be performed in two or more etching processes. In a first etch process, the structure undergoes an anisotropic etching process of the hetero-structure semiconductor layer 15. This same etching process can also be used, for example, to etch the wafer 10, to a certain depth, to form the recess 45a. In embodiments, an isotropic etch selective to the wafer 10 is then performed to form the undercut 45 and any remaining portions of the recess 45a. In embodiments, it is preferable, although not critical, to preserve as much of the hetero-structure semiconductor layer 15 as possible during the isotropic etching process. However, if hetero-structure semiconductor layer 15 is removed, partially or entirely, it can be regrown in a later processing step.

Those of skill in the art should understand that anisotropic etching is used in semiconductor chip processing, where photolithography is used to print resist lines or shapes on silicon wafers. To adequately reproduce vertical lines or shapes into underlying silicon and metal layers on a wafer held in the horizontal plane, the direction of etching is provided in the vertical direction only. The etchant is not permitted to spread in the horizontal plane. Isotropic etching, on the other hand, is non-directional removal of material from a substrate via a chemical process using an etchant substance. The etchant may be a corrosive liquid or a chemically active ionized gas, known as a plasma.

Figure 5:
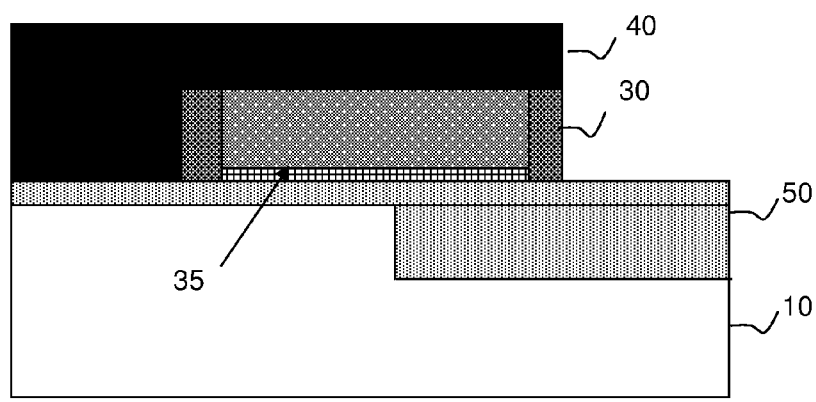

In FIG. 5, the recess and undercut are filled with a hetero-structure semiconductor layer 50 epitaxially grown on the wafer 10. In embodiments, the hetero-structure semiconductor layer 50 can be, for example, a hetero-silicon material. For example, in a pFET structure, the hetero-silicon material can be, for example, a SiGe alloy. In an nFET structure, the hetero-silicon material can be, for example, a SiC alloy. The hetero-structure semiconductor layer 50 is planar or substantially planar with the hetero-structure semiconductor layer 15.

Figure 6:
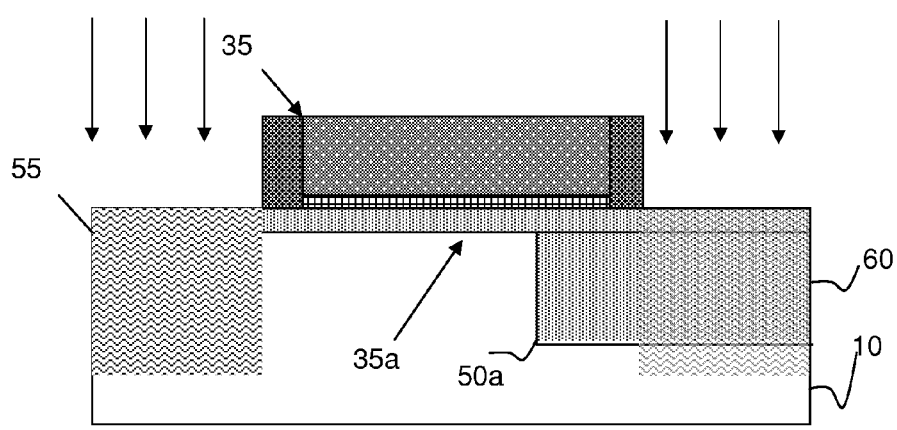

In FIG. 6, the resist is removed from the structure of FIG. 5, and the source 55 and drain 60 are formed using conventional doping and/or implant processes. The source region, the drain region and the channel region can be doped with a same dopant type, e.g., doped P-type. In embodiments, the drain 60 is formed in the thicker hetero-structure semiconductor layer 50; whereas, the source 55 is formed in the thinner hetero-structure semiconductor layer 15 and extends into the wafer 10. In embodiments, however, it is also contemplated by the present invention that the source 55 can be formed in the thicker hetero-structure semiconductor layer 50 (as can equally be representative of the structure of FIG. 6). In either of the embodiments, the depth of the doped regions, e.g., drain 60 or source 5 will extend into the wafer 10, beyond the hetero-structure semiconductor layer 50. Also, the hetero-structure semiconductor layer 50 will have an undoped portion 50a under the channel 35a and at the edge of the doped region. In this way, an asymmetric FET structure is formed with drain 60 (or source 55) partially contained in the hetero-structure semiconductor layer 50. The hetero-structure semiconductor layer 50 is thicker adjacent to the drain 60 (or source) than under the remaining portion of the channel 35a.

Prior to the present invention, the confinement of inversion carriers in a thin layer of semiconductor material was not a recognized problem in the art. It was only after conducting work in other issues of FET performance that the problem of confinement in a thin layer of semiconductor material was accidently found by noticing current loss at high driving voltages. Once this problem was recognized, the heterostructure semiconductor layer of the present invention was found to provide many unexpected advantages and performance improvements over conventional FETs, as discussed herein.

Figure 7:
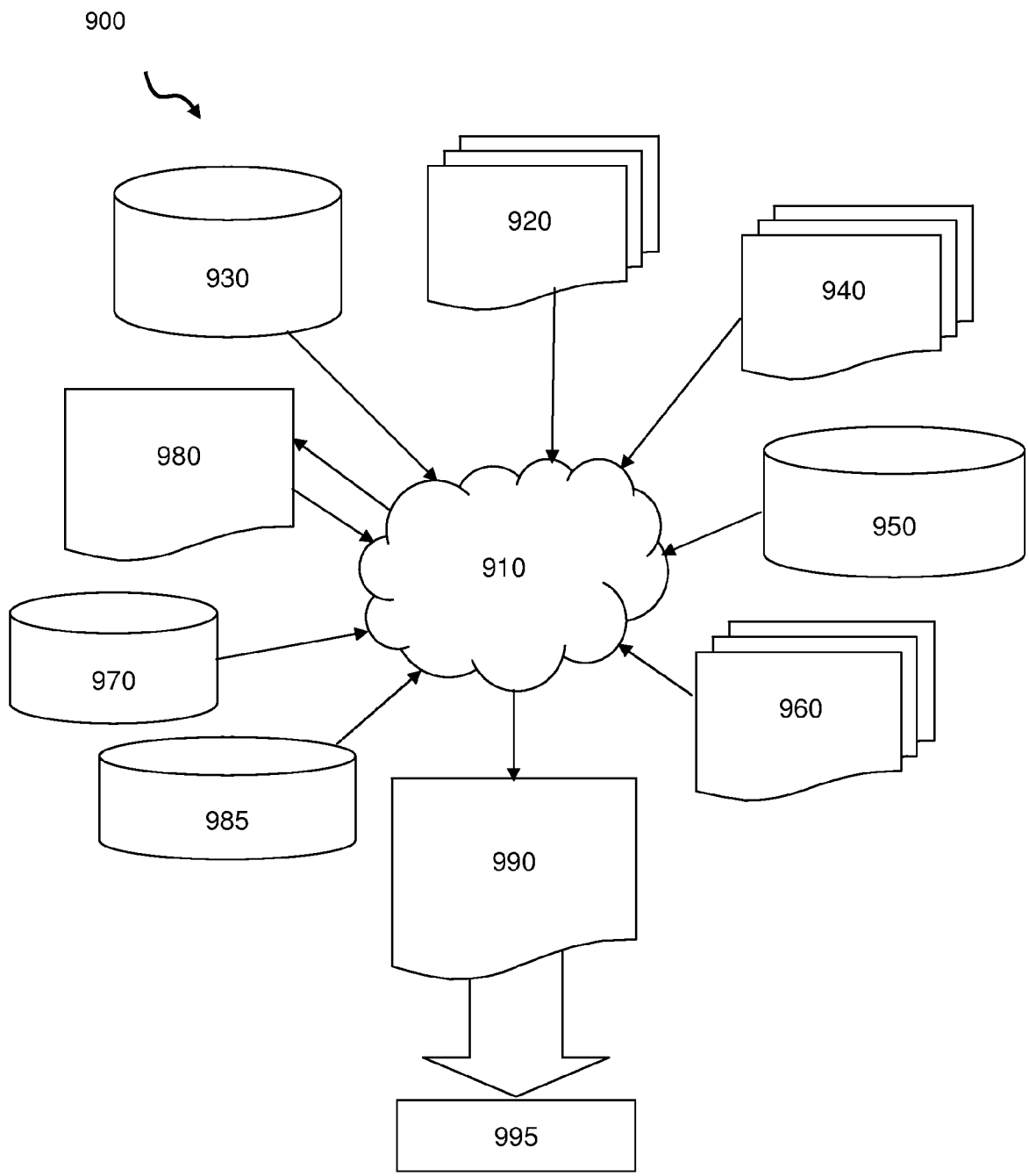
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A structure, comprising:
    a semiconductor substrate; and
    an epitaxially grown hetero-structure semiconductor layer on the semiconductor substrate, the epitaxially grown hetero-structure semiconductor layer including an alloy having a band structure and thickness that confines inversion carriers in a channel region, and a thicker portion extending deeper into the semiconductor substrate at an edge of a doped region than in the channel region, wherein the thicker portion avoids confinement of the inversion carriers at the edge of the doped region.

2. The structure of claim 1, wherein the epitaxially grown heterostructure semiconductor layer comprises a SiGe alloy.

3. The structure of claim 1, wherein the epitaxially grown hetero-structure semiconductor layer comprises a SiC alloy.

4. The structure of claim 1, wherein a thickness of the epitaxially grown hetero-structure semiconductor layer that confines the inversion carriers is between about 2 nm to about 10 nm.

5. The structure of claim 1, wherein:
    the epitaxially grown hetero-structure semiconductor layer is asymmetric; and
    the thicker portion of the asymmetric epitaxially grown hetero-structure semiconductor layer is formed in an undercut under a portion of the channel region, at an edge of a drain and in a recess formed in the drain.

6. The structure of claim 5, wherein the epitaxially grown hetero-structure semiconductor layer formed in the undercut is about 20% of a channel length.

7. The structure of claim 6, wherein the epitaxially grown hetero-structure semiconductor layer formed in the undercut has a length of about 10 Å to 30 Å.

8. The structure of claim 6, wherein the thicker portion of the epitaxially grown hetero-structure semiconductor layer has a thickness of about 50 Å to about 500 Å.

9. The structure of claim 8, wherein the thicker portion of the epitaxially grown hetero-structure semiconductor layer has a thickness of about 100 Å.

10. The structure of claim 1, further comprising a gate structure on the epitaxially grown hetero-structure semiconductor layer, over the channel region and between a drain and a source.

11. The structure of claim 1, wherein the epitaxially grown hetero-structure semiconductor layer is formed in an undercut under a portion of the channel region, the edge of the doped region is an edge of a source and in a recess formed in the source.

12. A structure, comprising:
    a channel formed over a silicon substrate and under a gate structure, separating a source region and a drain region; and
    an asymmetric hetero-silicon layer formed in the channel and extending into the source region and the drain region, the hetero-silicon layer having a first thickness in the channel and a second thickness at an edge of the drain region and extending into the drain region, the second thickness being greater than the first thickness.

13. The structure of claim 12, wherein the first thickness is provided in the source region and extending into the channel region.

14. The structure of claim 12, wherein the hetero-silicon layer is SiGe.

15. The structure of claim 12, wherein the source region and the drain region are doped a same dopant type.

16. The structure of claim 15, wherein the source region and the drain region are doped P-type.

17. The structure of claim 15, wherein the hetero-silicon layer is an epitaxially grown semiconductor layer including an alloy having a band structure and thickness that confines inversion carriers in the channel, and the second thickness extends deeper into the silicon substrate at a doped edge of the drain to avoid confinement of the inversion carriers at the doped edge.

18. The structure of claim 17, wherein the second thickness of the epitaxially grown semiconductor layer is about 100 Å.

19. A method, comprising:
epitaxially growing a hetero-structure semiconductor layer on a semiconductor substrate and within a trench etched under and on a side of a gate structure, the epitaxially grown hetero-structure semiconductor layer including an alloy having a band structure that confines inversion carriers in a channel region under the gate structure, and grown to a deeper portion into the semiconductor substrate at an edge of a doped region, wherein the deeper portion avoids confinement of the inversion carriers at the doped edge.

20. The method of claim 19, wherein the epitaxially growing the hetero-structure semiconductor layer comprises:
epitaxially growing a first semiconductor layer on the semiconductor substrate;
epitaxially growing a second semiconductor layer in the trench; and
providing the doped region in the second semiconductor layer on the side of the gate structure such that the edge of the doped region has a deeper portion of the second semiconductor layer than the first semiconductor layer within the channel region of the gate structure adjacent to the deeper portion of the second semiconductor layer.

21. The method of claim 19, wherein the deeper portion of the second semiconductor layer, avoids confinement of inversion carriers and is a same material as the first semiconductor layer.

22. The method of claim 19, wherein the second semiconductor layer is grown to a thickness of about 50 Å to about 500 Å.

23. The method of claim 19, wherein the etching is a tailored anisotropic and isotropic etching.

24. The method of claim 19, wherein the doped region is a drain region.

25. A design structure tangibly embodied in a machine readable medium for designing, manufacturing, or testing an integrated circuit, the design structure comprising:
a semiconductor substrate; and
an epitaxially grown hetero-structure semiconductor layer on the semiconductor substrate, the epitaxially grown hetero-structure semiconductor layer including an alloy having a band structure and thickness that confines inversion carriers in a channel region, and a thicker portion extending deeper into the semiconductor substrate at a doped edge than in the channel region, wherein the thicker portion avoids confinement of the inversion carriers at the doped edge.

26. A structure, comprising:
a semiconductor substrate; and
an epitaxially grown hetero-structure semiconductor layer on the semiconductor substrate, the epitaxially grown hetero-structure semiconductor layer including an alloy having a band structure and thickness that confines inversion carriers in a channel region, and a thicker portion extending deeper into the semiconductor substrate at an edge of a doped region than in the channel region, wherein the thicker portion avoids confinement of the inversion carriers at the edge of the doped region,
wherein:
the structure is an asymmetric hetero junction field effect transistor;
the epitaxially grown hetero-structure semiconductor layer is comprised of the thicker portion and a thin portion;
the thin portion is on an upper surface of the semiconductor substrate;
the thicker portion is under and on a single side of a gate structure; and
the epitaxially grown hetero-structure semiconductor layer extends from a first source/drain to a second source/drain under an entirety of the gate structure.

* * * * *